United States Patent [19]

Lambeth

[11] Patent Number: 4,644,572
[45] Date of Patent: Feb. 17, 1987

[54] FILL AND SPILL FOR CHARGE INPUT TO A CCD

[75] Inventor: David N. Lambeth, Webster, N.Y.

[73] Assignee: Eastman Kodak Company, Rochester, N.Y.

[21] Appl. No.: 797,093

[22] Filed: Nov. 12, 1985

[51] Int. Cl.[4] .................... G11C 19/28; H01L 29/78
[52] U.S. Cl. ...................................... 377/60; 357/24
[58] Field of Search ............... 357/24, 30; 377/57–63

[56] References Cited

U.S. PATENT DOCUMENTS

| | | | |
|---|---|---|---|
| 4,034,199 | 7/1977 | Lampe et al. | 357/24 |
| 4,139,784 | 2/1979 | Sauer | 307/221 |
| 4,178,519 | 12/1979 | Engeler et al. | 307/221 |
| 4,191,895 | 3/1980 | Levine et al. | 307/221 |
| 4,191,896 | 3/1980 | Sauer et al. | 307/221 |
| 4,521,106 | 6/1985 | Lambeth | 356/1 |

OTHER PUBLICATIONS

"Charge Transfer Devices", by Sequin & Tompsett, Academic Press, Inc., 1975, pp. 49 and 73.
Teranishi et al., "An Interline CCD Image Sensor with Reduced Image Lag", IEEE Trans. Electron Devices, vol. ED-21, (12/74), pp. 1829–1833.
Kosonocky et al, "Basic Concepts of Charge-Coupled Devices", RCA Review, vol. 36, (9/75), pp. 567–593.

Primary Examiner—Gene M. Munson
Attorney, Agent, or Firm—Thomas H. Close

[57] ABSTRACT

A method and apparatus for introducing a measured amount of charge into the potential wells of a charge-coupled device employs a time dependent spill and fill transfer process.

6 Claims, 5 Drawing Figures

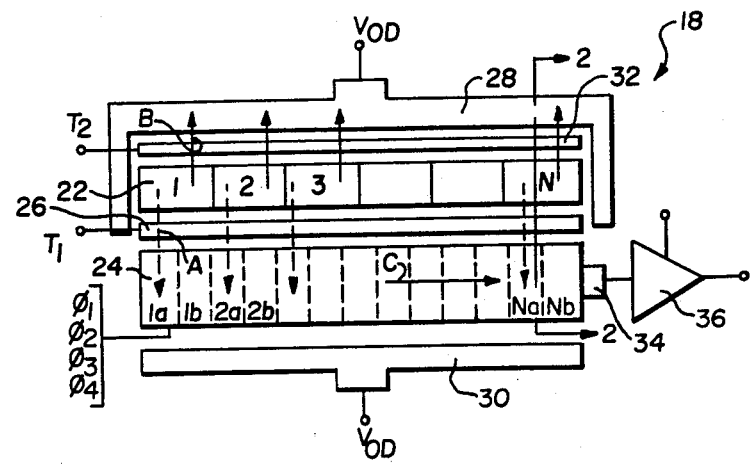
FIG 1
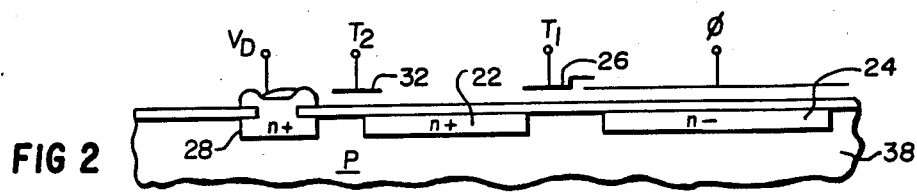
FIG 2
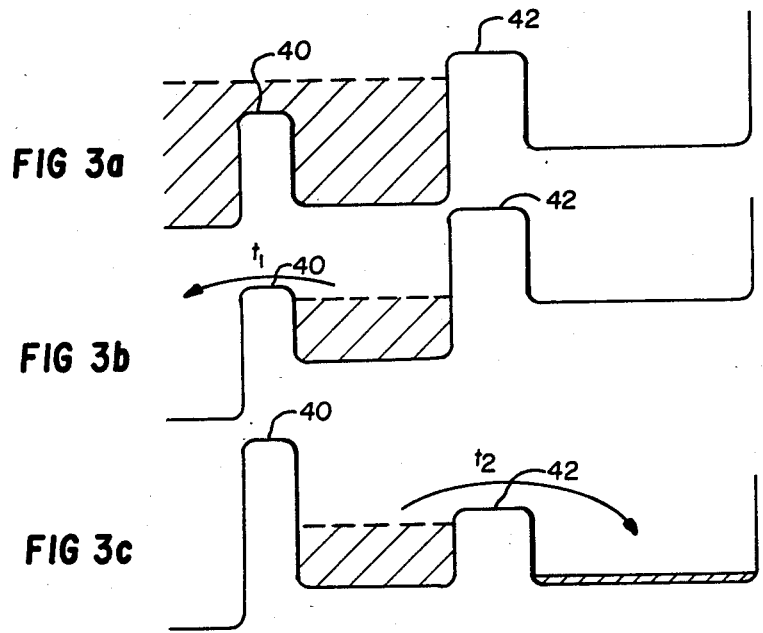
FIG 3a
FIG 3b
FIG 3c

FILL AND SPILL FOR CHARGE INPUT TO A CCD

TECHNICAL FIELD

The present invention relates to a method and apparatus for introducing a measured quantity of charge into the potential wells of a charge-coupled device (CCD), and more particularly to a method and apparatus of the type known as fill and spill.

BACKGROUND ART

It is known that the use of a uniform bias charge, or FAT ZERO, in a CCD shift register improves the transfer efficiency of the shift register, see "Charge Transfer Devices" by Sequin and Tompsett, Academic Press, Inc., 1975, page 73. To insure that a high signal-to-noise ratio is achieved in the CCD, the magnitude of the FAT ZERO must be carefully controlled.

One way of introducing a controlled amount of charge into the potential wells of a CCD is by the "fill and spill" method, see Sequin and Tompsett, page 49. According to the "fill and spill" method, an input signal voltage is applied as a voltage difference between two electrodes in a CCD, to produce a metering well under the second electrode. The size of the metering well depends linearly upon the signal voltage difference. An input diode is then pulsed to over fill the metering well with signal charge and to subsequently drain the excess charge from the metering well to the level defined by the first electrode.

This fill and spill method provides generally good linearity, and reasonably low noise. However, in some situations where very small, very accurate charges are required, it proves to be difficult to achieve reliable control of the charge size and uniformity. An example of such a situation is the image sensor shown in U.S. Pat. No. 4,521,106 issued June 4, 1985 to the present inventor. The image sensor is employed in a rangefinder device to detect the apparent location of a spot of light projected on an object in a scene. The distance measuring accuracy of the device is a function of the signal-to-noise ratio that can be achieved in the image sensor. The image sensor includes a row of photodiodes charge coupled on one side by a transfer gate to a drain diode for resetting the photodiodes, and charge coupled on the other side by a second transfer gate to a CCD shift register, for reading out the photocharges generated by the photodiodes. The channels under the transfer gate are surface channels, and the CCD shift register is a buried channel. The signal-to-noise ratio of the image sensor is improved if a FAT ZERO is introduced into the CCD shift register and especially into the surface channel between the photodiodes and the CCD shift register. The photodiodes in the image sensor can be employed as metering wells to introduce bias charges into the potential wells of the CCD by direct analogy to the conventional "fill and spill" process. However, to achieve a high signal-to-noise ratio, very small, accurately metered charges need to be used. It is difficult to achieve this high level of accuracy with the conventional spill and fill technique, because of the difficulty of generating carefully controlled differences in potential barrier heights between the two transfer gates.

Accordingly, it is an object of the present invention to provide an improved fill and spill method and apparatus for introducing small signals into the charge transfer cells of a CCD that is free from the difficulties noted above.

DISCLOSURE OF THE INVENTION

The above noted object is achieved according to the present invention by employing a time dependent spill and fill charge transfer process, rather than the conventional voltage dependent process. The metering well is filled to the height of a first potential barrier between the input diode and the metering well in the normal manner by pulsing the input diode, then a subthreshold current of thermally activated charge is allowed to transfer out of the metering well back into the input diode over the first potential barrier for a period of time $t_1$. Next, the first potential barrier is raised and a second potential barrier formed by a second transfer gate between the metering well, and a potential well of the CCD is lowered to the same height as the first potential barrier during time $t_1$ and a thermally activated subthreshold current of charge is allowed to transfer out of the metering well over the second potential barrier into the potential well of the CCD for a time $t_2$. The resulting charge transferred to the potential well of the CCD is proportional to the log of the ratio $t_2/t_1$ and is controllable to a very high accuracy by controlling the times $t_2$ and $t_1$.

BRIEF DESCRIPTION OF THE DRAWINGS

FIG. 1 is a schematic diagram of an image sensor useful in practicing the present invention;

FIG. 2 is a schematic cross-sectional diagram of the image sensor taken along the lines 2—2 in FIG. 1; and FIG. 3a-c are potential diagrams illustrating the operation of the present invention.

MODES OF CARRYING OUT THE INVENTION

FIG. 1 shows a linear image sensor 18 which may be used according to the present invention. A range finder device incorporating such an image sensor is described in U.S. Pat. No. 4,521,106 issued June 4, 1985 to the present inventor. The image sensor 18 includes a linear array of N photosensors such as photodiodes 22, and a charge-coupled device (CCD) shift register 24. The CCD shift register has 2N cells labeled 1a, 1b, 2a, 2b,... . Na, Nb. A transfer gate 26 between the array of photosensors 22 and CCD shift register 24 is actuable for transferring photocharge (in the direction of arrow A) from the photosensors to the alternate cells of the CCD shift register (those subscripted with an "a"). A second transfer gate 32 between the photosensor array 22 and reset drain 28 is actuable for transferring charge (in the direction of arrow B) from the photodiodes 22 into the reset diode 28. The CCD shift register is a buried channel CCD, and the transfer channels created by the transfer gates 26 and 32 are surface channels.

The signals in the CCD shift register 24 are shifted serially in the direction of arrow C to an output diode 34 by applying four phase clock signals $\Phi_{1-4}$ to the transfer electrodes (not shown) of the CCD shift register. The photosignals are detected at the output by a preamplifier 36.

To maximize the signal-to-noise ratio of the image sensor 18, it is desirable to insert a predetermined small signal (FAT ZERO) into the cells of the CCD shift register 24 through the surface channel formed by transfer gate 26 prior to the operation of the image sensor.

FIG. 2 shows a cross section of the image sensor 18 taken along lines 2—2 in FIG. 1. The image sensor is constructed on a semiconductor substrate 38 such as single crystal p-type silicon. The reset diode 28 is formed by a highly doped region of n-type impurities. The photodiode 22 is likewise formed by a highly doped n-type region. The buried channel of the CCD shift register 24 is formed by a less highly doped region of n-type impurities.

A carefully controlled amount of charge is introduced into the potential wells of the CCD according to the invention as follows. Voltages $V_T1$ and $V_T2$ are applied to the transfer gates 26 and 32 such that the potential barrier 40 between the reset diode 28 and the photodiode 22 is lowered, and the potential barrier 42 between the photodiode 22 and CCD 24 is raised, see FIG. 3a. The voltage on the reset diode 28 is pulsed to fill the photodiode 22 with photocharge to the top of potential barrier 40. The voltages $V_T1$ and $V_T2$ on the transfer gates are held in this condition for a time $t_1$ during which time a subthreshold current of thermally activated electrons are transferred over the potential barrier 40 out of the photodiode 22 (see FIG. 3b). Next, the voltages on the gates 26 and 32 are reversed such that potential barrier 40 is high and barrier 42 is low (see FIG. 3c). The voltages $T_T1$ and $V_T2$ on the transfer gates are held in this condition for a time $t_2$ during which time a subthreshold current of thermally activated electrons are transferred over the potential barrier 42 into the CCD shift register.

The rate at which the subthreshold current of thermally activated electrons are transferred over the potential barriers 40 or 42 is given by $$I = I\exp{-qV(t)/kT} \quad (1)$$

where V(t) is the time dependent potential difference between the photodiode and the potential barrier formed by the transfer gate (V(t) varies with time due to the loss in charge from the photodiode); the prefactor $I_0$ is a function of the potential difference between the photodiode and the transfer gate at time $t_0$; q is the charge on an electron; k is the Boltzmann constant; and T is the temperature in degrees Kelvin. Integrating this current from the time that the transfer gate is first lowered, to the time at which it is raised again gives the charge transferred into either the reset diode or the CCD during the time periods $t_1$ or $t_2$ respectively. If the potential barrier 40 is lowered to a given level during time period $t_1$, and the potential barrier 42 is lowered to the same low level during the time $t_2$, the total charge Q transferred to the CCD will be approximately $$Q = (CkT \ln t_2/t_1 \quad (2)$$

where C is the photodiode capacitance. This approximation is valid for times $t_2 > t_1$. In practice, the capacitance of the diode is chosen such that $t_2/t_1$ is approximately 8 for generating the desired Q.

Thus the total charge transferred to the CCD is a function of the log of the ratio of the times $t_2$ and $t_1$ and not a strong function of the magnitude of the voltage applied to gates 26 and 32 since a single reference voltage is applied to both gates. Therefore, the amount of charge introduced to the CCD can be easily controlled by adjusting the times $t_1$ and $t_2$ without the need for carefully adjusting small voltage differences.

Although the invention has been described with reference to a mode wherein the metering well is formed by a floating diode diffusion 22, it will be apparent to those skilled in the art that the metering well could likewise be formed by an MOS capacitor.

Industrial Applicability and Advantages

The time dependent spill and fill charge input process is useful in CCD's where very small carefully controlled input charges are required, such as the introduction of FAT ZERO's to improve the signal-to-noise ratio of a CCD. The time dependent fill and spill technique according to the present invention is advantageous in that small carefully controlled charges can be introduced without the need for generating small carefully controlled voltage differences on transfer gates as in the prior art schemes for fill and spill.

I claim:

1. A method for introducing a controlled signal charge into the potential well of a CCD, the CCD including an input diode, means for defining a metering well, a first transfer gate for forming a potential barrier between the input diode and the metering well and a second transfer gate for forming a potential barrier between the metering well and the potential well of the CCD; comprising the steps of:
    a. charge coupling the metering well to the input diode by applying a voltage to the first transfer gate to lower the potential barrier thereunder and applying a voltage to the second transfer gate to raise the potential barrier thereunder;
    b. filling the metering well by pulsing the input diode;
    c. allowing a subthreshold current of thermally activated charge to transfer out of the metering well back into the input diode over the potential barrier formed by the first transfer gate for a time $t_1$;
    d. charge coupling the metering well to the potential well of the CCD by applying a voltage to the first transfer gate to raise the potential barrier thereunder and a voltage to the second transfer gate to lower the potential barrier thereunder to the same level that the potential barrier under the first electrode was lowered in step a; and
    e. allowing a subthreshold current of thermally activated charge to transfer out of the metering well over the potential barrier formed by the second transfer gate into the potential well of the CCD for a time $t_2$, whereby the amount of charge transferred to the potential well of the CCD is approximately proportional to the log of the ratio $t_2/t_1$.

2. A circuit for introducing a controlled charge into a potential well of a CCD, comprising:
    a. an input diode;
    b. means for forming a metering well
    c. a first transfer gate for forming a first potential barrier between the input diode and the metering well;
    d. a second transfer gate for forming a second potential barrier between the metering well and the potential well of the CCD;
    e. means for generating control voltages for raising and lowering the potential barriers formed by said first and second transfer gates;
    f. means for generating a voltage pulse on said input diode;
    g. control means for:
        (1) applying a control voltage to said first transfer gate, to lower said first potential barrier and a control voltage to said second transfer gate to raise said second potential barrier;
        (2) applying said voltage pulse to said diode;

(3) executing a time delay $t_1$;

(4) applying a control voltage to said first transfer gate to raise said first potential barrier and a voltage to said second transfer gate to lower said second potential barrier to the same level that the first potential barrier was lowered in step (g.1);

(5) executing a time delay $t_2$, whereby a charge approximately proportional to the log of the ratio $t_2/t_1$ is introduced into the potential well of the CCD.

3. The apparatus claimed in claim 2, wherein; said means for forming a metering well is a floating diode.

4. The apparatus claimed in claim 3, wherein said floating diode is a photodiode.

5. A method of introducing a controlled charge into a potential well of a CCD, characterized by: filling a metering well by the fill and spill process, allowing a subthreshold current of thermally activated charge to transfer out of the metering well over a first potential barrier for a time $t_1$; coupling the metering well to the potential well of the CCD via a second potential barrier of the same height as said first potential barrier; and allowing a subthreshold current of thermally activated charge to transfer out of the metering well into the potential well for a period of time $t_2$, whereby a charge approximately proportional to the log of the ratio $t_2/t_1$ is introduced into the potential well.

6. Apparatus for introducing a controlled amount of charge into the potential well of a CCD device of the type having a floating photodiode, a drain diode, first transfer gate means for forming a potential barrier between the photodiode and the drain diode, and second transfer gate means for forming a potential barrier between the photodiode and the potential well of the CCD, characterized by:

means for applying a control signal to said first transfer gate to lower said first potential barrier to a predetermined height;

means for pulsing said drain diode to fill said photodiode with charge;

means for affecting a time delay of $t_1$ to allow a subthreshold current of thermally activated charge to transfer out of said photodiode into said drain diode over said first potential barrier;

means for applying control signals to said first transfer gate to raise the height of said first potential barrier and to said second transfer gate to lower said second potential barrier to the same height as said first potential barrier during time $t_1$; and means for affecting a time delay $t_2$ to allow a subthreshold current of thermally activated charge to transfer out of said photodiode into said potential well over said second potential barrier.

* * * * *